United States Patent [19]
Lin

[11] Patent Number: 6,140,220
[45] Date of Patent: Oct. 31, 2000

[54] DUAL DAMASCENE PROCESS AND STRUCTURE WITH DIELECTRIC BARRIER LAYER

[75] Inventor: Kang-Cheng Lin, Taipei, Taiwan

[73] Assignee: Industrial Technology Institute Reseach, Hsin-Chu, Taiwan

[21] Appl. No.: 09/349,843

[22] Filed: Jul. 8, 1999

[51] Int. Cl.$^7$ .............................................. H01L 21/4763
[52] U.S. Cl. .................... 438/618; 438/597; 438/637; 438/639
[58] Field of Search ................... 438/618, 637, 438/639

[56] References Cited

U.S. PATENT DOCUMENTS

| | | | |
|---|---|---|---|
| 5,466,639 | 11/1995 | Ireland | 437/195 |
| 5,612,254 | 3/1997 | Mu et al. | 437/195 |
| 5,689,140 | 11/1997 | Shoda | 257/774 |
| 5,705,430 | 1/1998 | Avanzino et al. | |
| 5,753,967 | 5/1998 | Lin | 257/635 |
| 6,001,735 | 12/1999 | Tsaz | |

*Primary Examiner*—Kevin M. Picardat
*Assistant Examiner*—D. M. Collins
*Attorney, Agent, or Firm*—George O. Saile; Stephen B. Ackerman

[57] ABSTRACT

An improved dual damascene structure, and process for manufacturing it, are described in which the via hole is first lined with a layer of silicon nitride prior to adding the diffusion barrier and copper. This allows use of a barrier layer that is thinner than normal (since the silicon nitride liner is an effective diffusion barrier) so that more copper may be included in the via hole, resulting in an improved conductance of the via. A key feature of the process that is used to make the structure is the careful control of the etching process. In particular, the relative selectivity of the etch between silicon oxide and silicon nitride must be carefully adjusted.

9 Claims, 5 Drawing Sheets

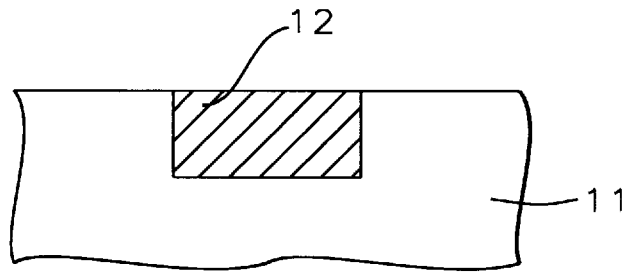
FIG. 1 - Prior Art
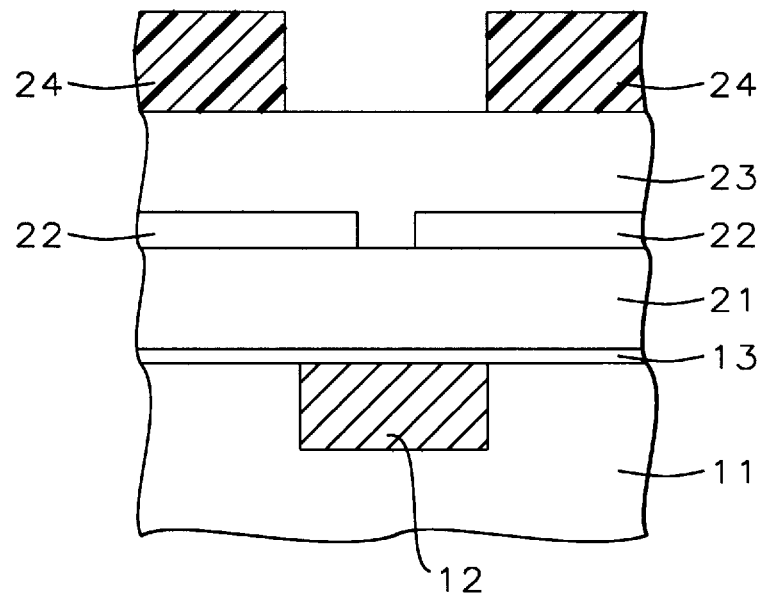
FIG. 2 - Prior Art
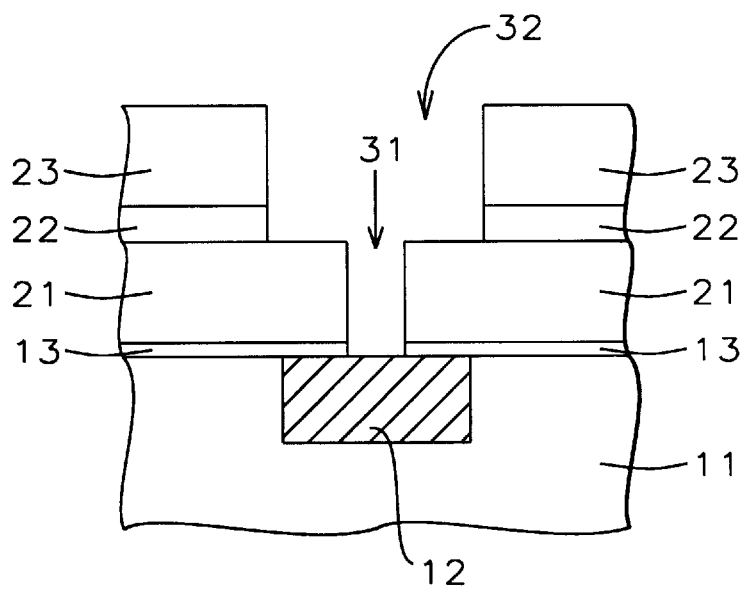
FIG. 3 - Prior Art

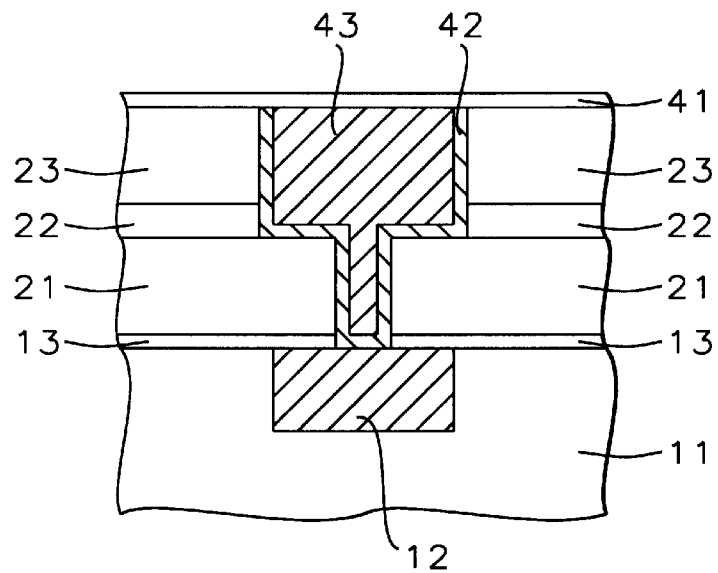
FIG. 4 – Prior Art
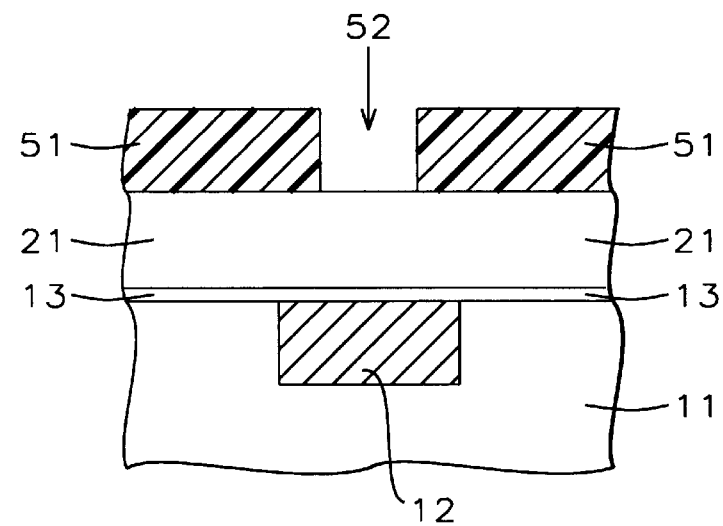
FIG. 5
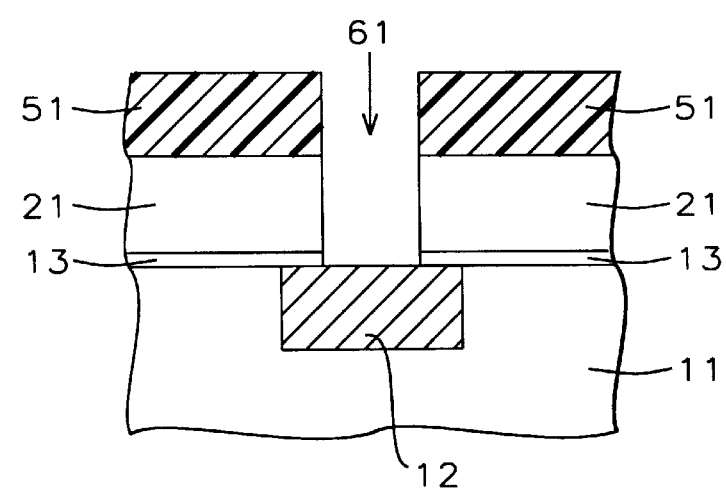
FIG. 6

DUAL DAMASCENE PROCESS AND STRUCTURE WITH DIELECTRIC BARRIER LAYER

FIELD OF THE INVENTION

The invention relates to the general field of dual damascene wiring in integrated circuits with particular reference to maximizing conductance of the vias.

BACKGROUND OF THE INVENTION

The term 'damascene' is derived from a form of inlaid metal jewelry first seen in the city of Damascus. In the context of integrated circuits it implies a patterned layer imbedded on and in another layer such that the top surfaces of the two layers are coplanar.

The introduction of damascene wiring solved several problems that faced the semiconductor industry as wiring grew ever smaller and more complex. A damascene structure is, by definition, planarized, possible leakage problems due to incomplete coverage of wiring by inter metal dielectrics are eliminated, and rapid diffusers such as copper or silver can be more reliably confined by diffusion barriers.

Referring now to FIG. 1 we show layer 11 of silicon oxide which covers a partially completed integrated circuit (not shown). Embedded in layer 11 is a layer of metal 12 that fills a trench previously formed in the surface of 11 so that the top surfaces of 11 and 12 are co-planar.

In the standard process for contacting layer 12 through a double damascene structure the next steps are illustrated in FIG. 2. Silicon nitride layer 13 is deposited over the surfaces of 11 and 12 followed by silicon oxide layer 21. This, in turn, is followed by a second silicon nitride layer in which a via hole opening has been etched prior to over coating with a second silicon oxide layer 23. Also seen in the figure is a photoresist pattern 24 which will be used to define the trench that will carry the next layer of damascene wiring FIG. 3 illustrates the appearance of the structure after etching where via hole 31 extends all the way down to layer 12 and connects at its upper end to trench 32 which extends through layers 22 and 23. An important step to complete this structure is the deposition of barrier layer 42, which can be seen in FIG. 4, and which coats the walls of trench 32 as well as the walls of via hole 31 and the exposed upper surface of wiring layer 12. The trench and via hole are then over filled with copper layer 43 and the surface planarized giving the appearance shown in FIG. 4. Layer 41 of silicon nitride is the equivalent of layer 13 for this level of wiring.

It is important to note that the thickness of layer 42 is a compromise between providing adequate diffusion resistance and minimal electrical resistance. Although the barrier layer material is electrically conducting, its resistivity is relatively high so it increases resistance between the two levels of wiring (12 and 43) both because of contact resistance at the interface to 12 and because it occupies a significant portion of the total cross-section of the via hole, thereby reducing the amount of copper available to contribute to the conductance of the via.

During a routine search of the prior art no references that teach the process or structure of the present invention were encountered. Several references of interest were, however, found. For example, Lin (U.S. Pat. No. 5,753,967) deals with the problem of how to center the stud part of a dual damascene structure relative to the trench part. He teaches a self-aligned technique wherein the trench is first formed then given a coating of dielectric which serves as a hard mask for the formation of the stud opening.

Mu et al. (U.S. Pat. No. 5,612,254) describe formation of a dual damascene structure. First the metal stud portion is fully formed in a first dielectric layer. Then, a second layer of dielectric is deposited and the trench portion is aligned and formed therein. In one embodiment, there is a layer of silicon nitride between the two dielectrics but this does not extend into the stud region.

Ireland (U.S. Pat. No. 5,466,639) describes the procedure, detailed above, that has become the 'standard' process for forming a dual damascene structure.

Shoda (U.S. Pat. No. 5,689,140) teaches the use of two different adhesion layers in the stud and trench portions of a damascene structure. As a result, when the trench and stud get filled with metal, growth on the upper (trench) adhesion layer does not begin until growth in the lower (stud) portion is well along. Materials of choice for the first adhesion layer include a metal, silicon, and suicides. For the second adhesion layer, preferred materials include metal nitrides, metal borides, and metals.

SUMMARY OF THE INVENTION

It has been in object of the present invention to provide a process for forming a dual damascene structure.

A further object on the invention has been that said dual damascene structure provide low via hole resistance between wiring levels without sacrificing the effectiveness of the diffusion barrier.

These objects have been achieved by means a structure in which the via hole is first lined with a layer of silicon nitride prior to adding the diffusion barrier and copper. This allows use of a barrier layer that is thinner than normal (since the silicon nitride liner is an effective diffusion barrier) so that more copper may be included in the via hole, resulting in an improved conductance of the via. A key feature of the process that is used to make the structure is the careful control of the etching process. In particular, the relative selectivity of the etch between silicon oxide and silicon nitride must be carefully adjusted.

BRIEF DESCRIPTION OF THE DRAWINGS

FIG. 1 illustrates the starting point for forming a dual damascene structure according to the processes of the prior art.

FIG. 2 illustrates the next step in the process of the prior art wherein a silicon nitride hard mask is sandwiched between two layers of silicon oxide.

FIG. 3 shows the structure of FIG. 2 after it has been etched to form a via hole with a trench above it.

FIG. 4 illustrates a dual damascene structure formed according to the method of the prior art.

FIG. 5 shows the start of the process for forming a dual damascene structure according to the processes taught by the present invention.

FIG. 6 illustrates the formation of the via hole portion of the structure.

DESCRIPTION OF THE PREFERRED EMBODIMENTS

Figure 7:
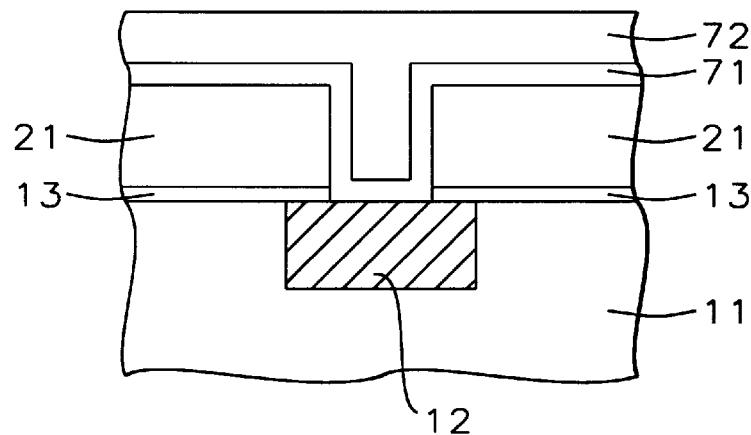
FIG. 7 illustrates a how the via hole of FIG. 6 is coated with a relatively thick layer of silicon nitride prior to the formation of the trench.

While we will describe the present invention in terms of the process used for its manufacture, said description will also serve to disclose the structure of the present invention.

Referring now to FIG. 5, the process begins with the provision of a partially completed integrated circuit whose uppermost layer is silicon oxide 11 (between about 3,000 and 12,000 Angstroms thick) in which is embedded a layer of damascene wiring 12. By definition, the top surfaces of layers 11 and 12 are coplanar. Silicon nitride layer 13 is then deposited over these upper surfaces using plasma enhanced chemical vapor deposition (PECVD) to a thickness between about 80 and 500 Angstroms. This is followed by the deposition of a second layer of silicon oxide 21 also using PECVD. Photoresist layer 51 is then laid down over 21 and patterned to form opening 52 which will define the size of the via hole that is to be etched in the next step.

FIG. 6 shows the appearance of the structure after via hole 61 has been formed by etching through both layers 21 and 13. Since metal layer 12 gets exposed and then acts as the etch stop in this case, it is important that the maximum internal dimension (diameter or width) of 61 be less than or equal to the width of 12. Typically this internal dimension is determined by the topography design rules. Since both silicon oxide and silicon nitride are etched during this step, an etchant having low selectivity between these two materials is used. An example of this is a carbon tetrafluoride plasma.

After removal of the photoresist, a conformal coating of silicon nitride 71 is deposited to coat the exposed portion of 12, the interior walls of via hole 61, and the surface of 21, as shown in FIG. 7. The process used to deposit this conformal layer of silicon nitride was PECVD for contacts and vias and low pressure (LP) CVD for contacts. Its thickness was between about 20 and 300 Angstroms. This is followed by the deposition of a third silicon oxide layer 72 (shown as having been planarized after its deposition) using PECVD, to a thickness between about 1,200 and 12,000 Angstroms.

Figure 8:
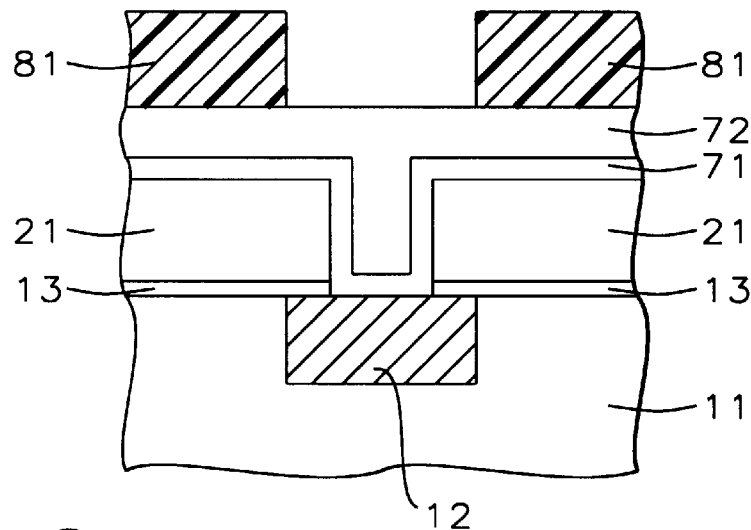
FIGS. 8 and 9 illustrate the formation of the trench, showing how a silicon nitride liner is formed inside the via hole.

As seen in FIG. 8, photoresist 81 is then laid down and patterned to define the shape and position of the damascene trench (93 in FIG. 9) that will be etched in the next step. As shown, this trench will have the same or greater width as 12 and will directly overlie it.

Figure 9:
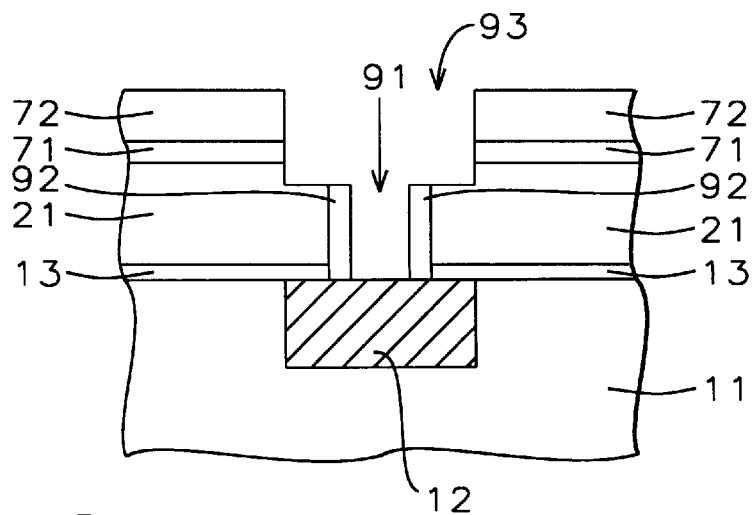

What follows next is a key feature of the invention. With patterned resist 81 in place, etching proceeds such that the structure shown in FIG. 9 is formed. As shown, the etching process used here removes all unprotected parts of layers 72, a portion of layer 21, as well as all unprotected horizontal portions of layer 71 (including the part that covered layer 12) while removing relatively little from the vertical portions of layer 71. To accomplish this the selected etching process has to selectively etch horizontal over vertical surfaces and must have a high etching selectivity for silicon nitride relative to silicon oxide. The first of these requirements is routinely met during reactive ion etching (RIE). If the second requirement is not met, layer 71 will etch through well before all of layer 72 has been removed from inside the via hole and too much of layer 21 will then be partially etched away before the bottom part of 71 can be removed. The amount of 21 that gets removed should be such that the depth of trench 93 does not exceed the thickness of layer 71. This then ensures that the amount that tubular structure 92 extends, downwards from the trench, is between about 0.2 and 1.5 microns. We have determined that an etching ratio that is between about 6 and 15:1 for oxide:nitride, gives satisfactory results, with 15:1 (oxide:nitride) being preferred.

To achieve the required selective etch ratio, a plasma made up of $CHF_3$ (or $CF_4$) plus oxygen was used. When etching is performed according to the above procedures, the result of this key step is the formation of tubular structure 92 of silicon nitride. 92 has an internal dimension (diameter or width) that is determined by the topography design rules and is generally between about 0.1 and 0.5 microns, which is the normal amount allowed for a via, and an external dimension of between about 0.1 and 0.6 microns, corresponding to a thickness that is less than about 0.1 microns.

The thickness of 92 allows it to serve as an excellent diffusion barrier. As a consequence, when conductive barrier layer 102 is laid down as the next step in the process (see FIG. 10) its thickness can be significantly reduced relative to what would be needed under the prior art (see layer 42 in FIG. 4). Our preferred material for barrier layer 102 has been tantalum nitride (TaN) but similar materials such as titanium, or titanium nitride could also have been used. The thickness that we have used for layer 102 has been between about 100 and 2,000 Angstroms, with about 500 Angstroms being preferred. This is about 10% the thickness of layer 42. Since the barrier layer material has a relatively high resistivity (about 50 microhm cm.), the ability to use this thinner layer (without sacrificing diffusion barrier effectiveness) reduces the resistance associated with the via by as much as 10%. Our preferred barrier layer has been about 500 Angstroms of tantalum nitride.

Figure 10:
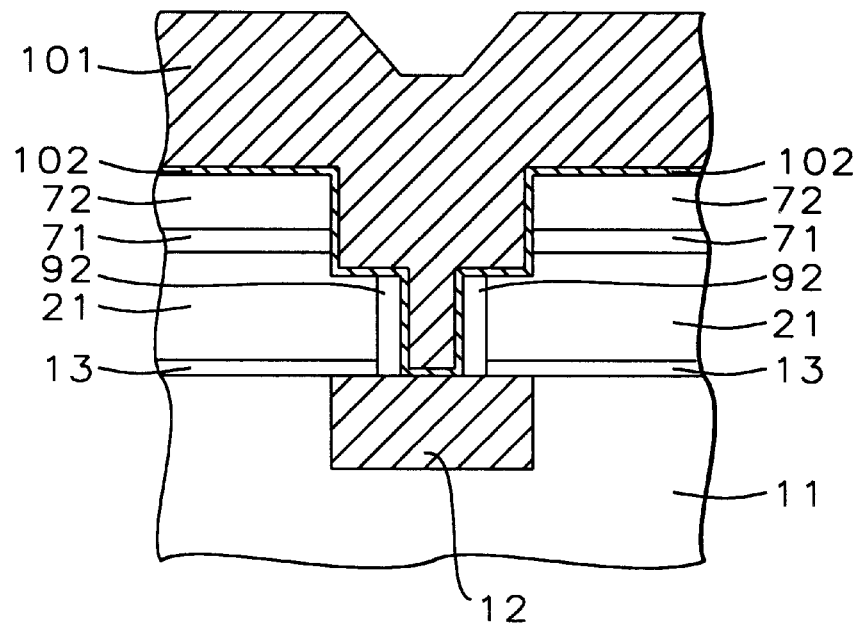
FIGS. 10 and 11 illustrate the final stages of the process notably filling the via hole and the trench with copper.
Figure 11:
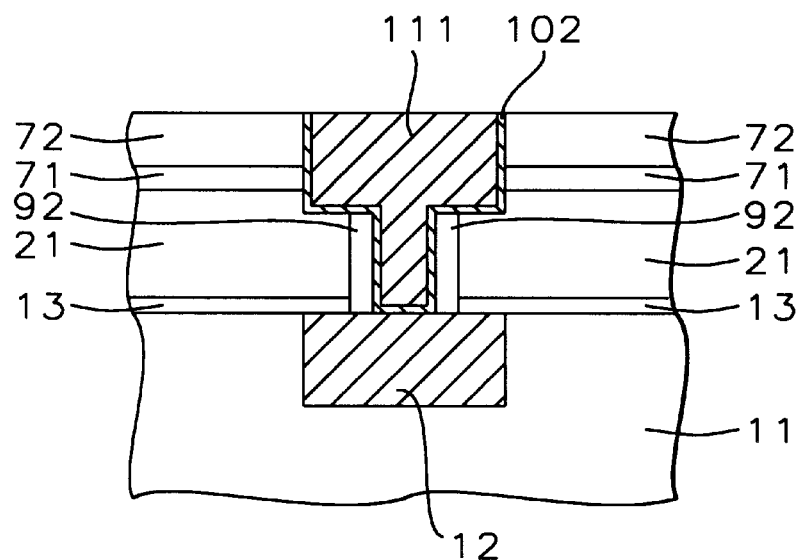
Figure 12:
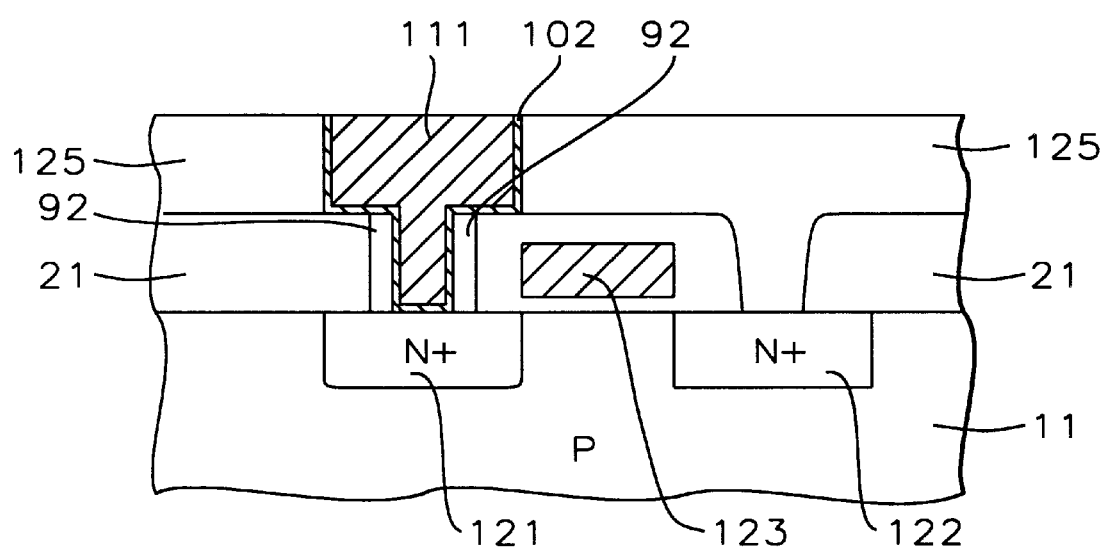
FIG. 12 shows how the structure of the invention may be used to contact a FET.

Continuing our reference to FIG. 10, the final steps in the process are the over-filling of via hole 91 and trench 93 with a metal such as copper. The excess metal is then removed by means of a planarizing process such as CMP so that the trench is evenly filled and the surface of layer 72 is exposed, as shown in FIG. 11. In FIG. 12 we illustrate the application of the invention contacting source 121 in an FET structure. Also seen in the figure are drain 122, polysilicon gate 123 and inter-metal layer (ILD) 125.

While the invention has been particularly shown and described with reference to the preferred embodiments thereof, it will be understood by those skilled in the art that various changes in form and details may be made without departing from the spirit and scope of the invention.

What is claimed is:

1. A dual damascene process, comprising:

providing a partially completed integrated circuit covered by a first layer of silicon oxide, having an upper surface, in which is embedded a first layer of damascene wiring whose upper surface is coplanar with said oxide upper surface;

depositing a first layer of silicon nitride on said upper layer and on said wiring;

depositing a second layer of silicon oxide over said first layer of silicon nitride;

patterning and etching the second layer of silicon oxide to form a via hole that extends through the first silicon nitride layer, thereby exposing said first layer of damascene wiring;

depositing a conformal layer of second silicon nitride on said exposed wiring layer, thereby forming a coating on all interior surfaces of the via hole as well as on said second silicon oxide layer;

over-filling the coated via hole with silicon oxide thereby forming a third silicon oxide layer over said second silicon nitride layer;

patterning and etching the third silicon oxide layer with an etchant that attacks both silicon oxide and silicon nitride with an etching ratio that is between about 6:1 and 15:1, for oxide:nitride, thereby forming a trench in the third silicon oxide layer that fully overlaps the via hole and that extends through the second silicon nitride layer into the second silicon oxide layer, and exposing said first layer of damascene wiring;

depositing a barrier layer to form a coating that covers all interior surfaces of the via hole and of the trench, as well as said exposed first wiring layer, and that covers the third silicon oxide layer;

over-filling the via hole and the trench with copper; and planarizing the copper layer whereby said trench is just filled with copper and said third silicon oxide layer is exposed.

2. The process of claim 1 wherein the step of depositing the first layer of silicon nitride further comprises using PECVD.

3. The process of claim 1 wherein the step of depositing the second layer of silicon oxide further comprises using PECVD.

4. The process of claim 1 wherein the via hole has a maximum internal dimension that is determined by the topography design rules.

5. The process of claim 1 wherein said first layer of silicon nitride is deposited to a thickness between about 80 and 500 Angstroms.

6. Process of claim 1 wherein said first layer of silicon oxide is deposited to a thickness between about 3,000 and 12,000 Angstroms.

7. The process of claim 1 wherein the step of depositing a conformal layer of silicon nitride further comprises using PECVD for contacts and vias and LPCVD for contacts.

8. The process of claim 1 wherein the step of depositing a third layer of silicon oxide further comprises using PECVD.

9. The process of claim 1 wherein the barrier layer is selected from the group consisting of tantalum nitride, titanium, and titanium nitride, and is deposited to a thickness between about 100 and 2,000 Angstroms.

* * * * *